United States Patent
Chang et al.

(10) Patent No.: US 6,711,195 B2
(45) Date of Patent: Mar. 23, 2004

(54) LONG-WAVELENGTH PHOTONIC DEVICE WITH GAASSB QUANTUM-WELL LAYER

(75) Inventors: Ying-Lan Chang, Cupertino, CA (US); Scott W. Corzine, Sunnyvale, CA (US); Russell D. Dupuis, Austin, TX (US); Min Soo Noh, Austin, TX (US); Jae Hyun Ryou, Austin, TX (US); Michael R. T. Tan, Menlo Park, CA (US); Ashish Tandon, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/087,422

(22) Filed: Feb. 28, 2002

(65) Prior Publication Data

US 2003/0161369 A1 Aug. 28, 2003

(51) Int. Cl.⁷ .................................................. H01S 5/00
(52) U.S. Cl. ........................................... 372/45; 372/50
(58) Field of Search ....................... 372/45, 50, 29.013, 372/75, 87, 38.01, 38.02

(56) References Cited

U.S. PATENT DOCUMENTS

| | | | | |
|---|---|---|---|---|
| 4,774,554 A | * | 9/1988 | Dentai et al. .................. 372/48 |
| 5,723,877 A | * | 3/1998 | Sugawa et al. ................ 257/59 |
| 5,737,353 A | * | 4/1998 | Sasaki .......................... 372/45 |
| 5,747,827 A | * | 5/1998 | Duggan et al. ................ 257/15 |
| 5,751,014 A | * | 5/1998 | Nakatsu et al. ............... 257/25 |
| 5,762,706 A | * | 6/1998 | Saito et al. .................. 117/105 |
| 5,790,578 A | * | 8/1998 | Takano ........................ 372/45 |
| 5,900,642 A | * | 5/1999 | Nakatsu et al. ............... 257/25 |
| 5,945,690 A | * | 8/1999 | Saito et al. .................... 257/94 |
| 5,959,239 A | * | 9/1999 | Baldasaro ................... 136/201 |
| 6,084,898 A | * | 7/2000 | Heffernan et al. ............. 372/45 |
| 6,111,904 A | * | 8/2000 | Takano ........................ 372/45 |
| 6,127,692 A | * | 10/2000 | Sugawa et al. ............... 257/30 |
| 6,148,017 A | * | 11/2000 | Borchert et al. .............. 372/50 |
| 6,434,178 B1 | * | 8/2002 | Ubukata ....................... 372/45 |
| 6,486,491 B1 | * | 11/2002 | Najda ........................... 257/18 |

* cited by examiner

Primary Examiner—Paul Ip
Assistant Examiner—Tuan Nguyen
(74) Attorney, Agent, or Firm—Ian Hardcastle (57) ABSTRACT

The long-wavelength photonic device comprises an active region that includes at least one quantum-well layer of a quantum-well layer material that comprises $In_yGa_{1-y}AsSb$ in which $y \geq 0$, and that additionally includes a corresponding number of barrier layers each of a barrier layer material that includes gallium and phosphorus. The barrier layer material has a conduction-band energy level greater than the conduction-band energy level of the quantum-well layer material and has a valence-band energy level less than the valence-band energy level of the quantum-well layer material.

19 Claims, 5 Drawing Sheets

LONG-WAVELENGTH PHOTONIC DEVICE WITH GAASSB QUANTUM-WELL LAYER

BACKGROUND OF THE INVENTION

Photonic devices include semiconductor lasers, e.g., vertical cavity surface-emitting lasers (VCSELs) and edge-emitting lasers (EELs), and semiconductor light-emitting diodes (LEDs). Applications for photonic devices are many and include optical communications, optical measuring instruments and optical storage devices.

Photonic devices that generate long-wavelength infra-red light are of great interest in the optical communications industry since existing optical fibers have a relatively low loss in this wavelength range. Wavelengths in the wavelength range that extends from about 1.5 to about 1.6 micrometers ($\mu$m), commonly referred to as the 1.55 $\mu$m wavelength range, are typically used in optical communications applications, since semiconductor lasers and other components that operate in this wavelength range are relatively low in cost and are widely available. However, optical fibers have a lower optical dispersion in a wavelength range that extends from about 1.25 $\mu$m to about 1.35 $\mu$m, commonly referred to as the 1.3 $\mu$m wavelength range. This wavelength range is less commonly used for optical communications because lasers that operate in this wavelength range are based on an indium phosphide (InP) substrate and so are substantially more expensive that lasers based on a gallium arsenide (GaAs) substrate. Moreover, it is difficult to make VCSELS that operate in the 1.3 $\mu$m wavelength range due to the lack of suitable mirror materials compatible with InP.

The active layer of a photonic device is the layer in which electrons and holes combine to generate light. Although it is possible to make photonic devices with a homogeneous active layer, an active layer that includes a quantum-well structure provides the photonic device with a lower threshold current, a higher efficiency and a greater flexibility in choice of emission wavelength.

A quantum-well structure is composed of at least one (n) quantum-well layer interleaved with a corresponding number (n+1) of barrier layers. Each of the quantum well layers has a thickness in the range from about one nanometer to about ten nanometers. The barrier layers are typically thicker than the quantum well layers. The semiconductor materials of the layers of the quantum-well structure depend on the desired emission wavelength of the photonic device. The semiconductor material of the barrier layers differs from that of the quantum-well layer, and has a larger bandgap energy and a lower refractive index than that of the quantum well layer.

The active layer is composed of the quantum-well structure sandwiched between two cladding layers. The semiconductor materials constituting the quantum-well structure are typically undoped. One of the cladding layers is doped n-type, the other of the cladding layers is doped p-type. Thus, the active layer has a p-i-n structure.

Figure 1:
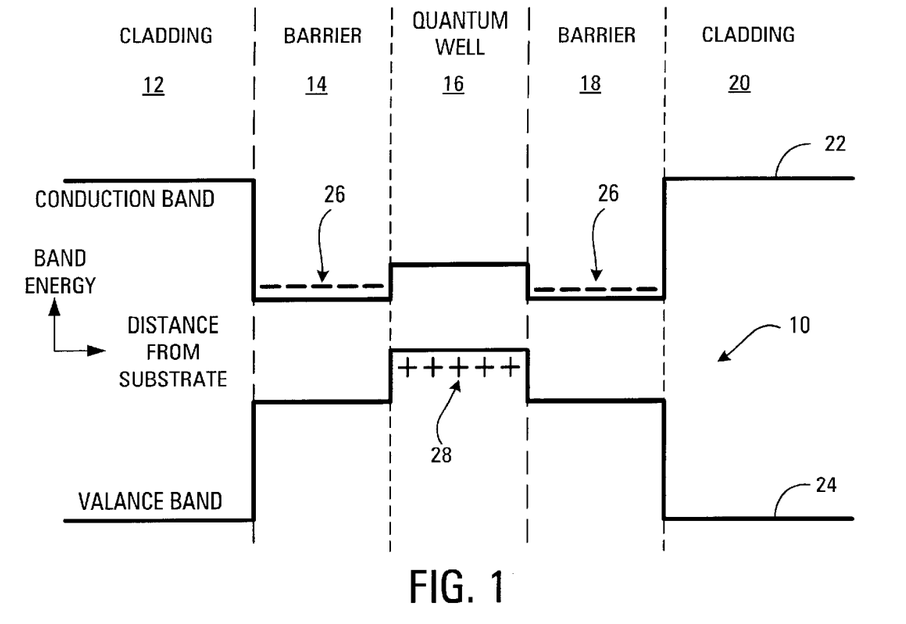
FIG. 1 is an energy-band diagram of an active region having a conventional Type II heterostructure.

A quantum-well structure composed of gallium arsenide antimonide (GaAsSb) quantum-well layers with gallium arsenide (GaAs) barrier layers has been proposed for the active region of VCSELS structured to generate light with a wavelength of 1.3 $\mu$m. FIG. 1 is an energy-band diagram of an exemplary active layer 10 incorporating such a quantum-well structure having one quantum-well layer. Band energy is plotted as ordinate and distance from the substrate is plotted as abscissa.

The active layer 10 is composed of the substrate-side cladding layer 12, the substrate-side barrier layer 14 of GaAs, the quantum-well layer 16 of GaAsSb, the remote-side barrier layer 18 of GaAs and the remote-side cladding layer 20. The energy-band diagram of FIG. 1 shows the energies of the conduction band 22 and the valence band 24 of the semiconductor material of each of the layers just described.

The quantum-well structure composed of the barrier layers 14 and 18 of GaAs and the quantum-well layer 16 of GaAsSb has what is known as a Type II heterostructure. In a Type II heterostructure, the energy of the valance band 24 of the GaAsSb of the quantum-well layer 16 is greater than the energy of the valance band of the GaAs of the barrier layers 14 and 18 and the energy of the conduction band 22 of the GaAsSb of the quantum-well layer is also greater than the energy of the conduction band of the GaAs of the barrier layers.

The line-up of the band energies in a quantum-well structure having a Type II heterostructure confines electrons 26 to the conduction band 22 of the barrier layers 14 and 18 and confines holes 28 to the valance band 24 of the quantum-well layer 16. As a result, the electron-hole recombination process occurs between carriers confined in physically-different layers and is called spatially indirect. An active layer incorporating a quantum-well structure having a Type-II heterostructure can emit and absorb photons with energies well below the bandgap energy of the material of either the quantum-well layer or the barrier layers. Photonic devices incorporating such an active layer operate at wavelengths much longer than those corresponding to the bandgap energies of the materials of the quantum-well structure. However, active layers incorporating a quantum-well structure having a Type-II heterostructure have a relatively low gain due to the low overlap between the electron and hole wave functions.

Another disadvantage of active layers incorporating a quantum-well structure having a Type II heterostructure is that edge-emitting lasers incorporating such an active layer have a threshold current density that depends on the device dimensions and an operating wavelength that depends on the operating current. These variations in threshold current density and operating wavelength can lead to problems in lasers used in optical communications applications where channel spacings of a few hundred GHz impose strict wavelength stability requirements.

In addition, for the active region to generate light at 1.3 $\mu$m, the GaAsSb of the quantum-well layer 16 has an antimony (Sb) fraction of about 0.35, i.e., x=~0.35 in $GaAs_{1-x}Sb_x$. With this antimony fraction, the GaAsSb has a lattice constant substantially larger than that of GaAs, so that the quantum-well layer is under substantial compressive strain when grown on GaAs. It is therefore difficult to fabricate active regions having more than one or two quantum wells without an unacceptably high defect density occurring as a result of relaxation of the strain. Barrier layers of GaAs are incapable of providing strain compensation for quantum-well layers of GaAsSb grown on a substrate of GaAs.

Figure 2:
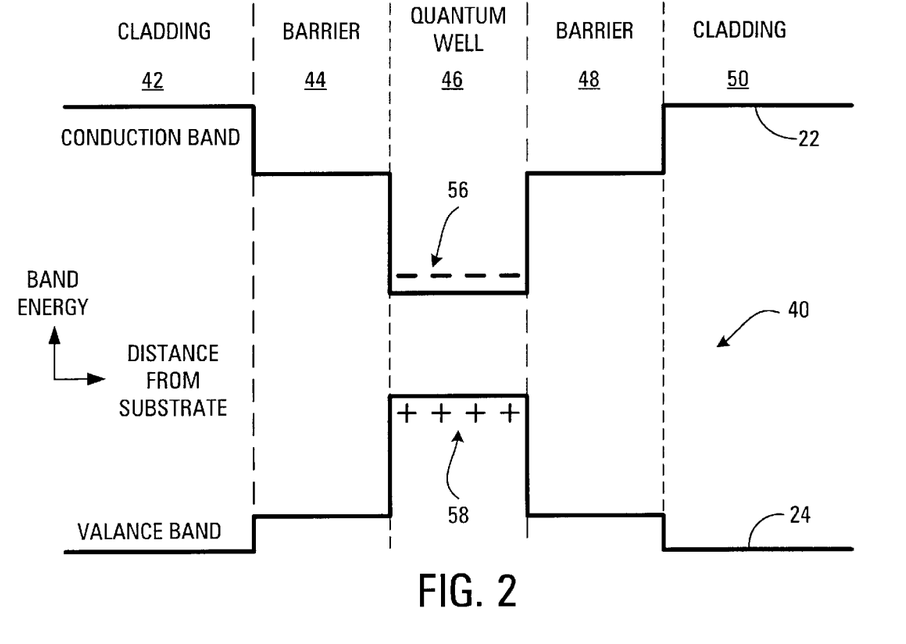
FIG. 2 is an energy-band diagram of an active region having a conventional Type I heterostructure.

An alternative quantum-well structure that has been proposed for the active region of VCSELs structured to generate light at 1.3 $\mu$m is composed of gallium arsenide antimonide (GaAsSb) quantum-well layers with aluminum gallium arsenide (AlGaAs) barrier layers. FIG. 2 is an energy-band diagram of an exemplary active layer 40 incorporating such a quantum-well structure having one quantum-well layer. As in the energy-band diagram of FIG. 1, band energy is plotted as ordinate and distance from the substrate is plotted as abscissa.

The active layer 40 is composed of the substrate-side cladding layer 42, the substrate-side barrier layer 44 of AlGaAs, the quantum-well layer 46 of GaAsSb, the remote-side barrier layer 48 of AlGaAs and the remote-side cladding layer 50. The energy-band diagram shows the energies of the conduction band 22 and the valence band 24 of the semiconductor materials of the layers just described.

The active layer composed of the barrier layers 44 and 48 of AlGaAs and the quantum-well layer 46 of GaAsSb has what is known as a Type I heterostructure. In a Type I heterostructure composed of GaAsSb and AlGaAs, the energy of the valance band 24 of the GaAsSb of the quantum-well layer 46 is greater than the energy of the valance band of the AlGaAs of the barrier layers 44 and 48, but the energy of the conduction band 22 of the GaAsSb of the quantum-well layer is less than the energy of the conduction band of the AlGaAs of the barrier layers.

The line-up of the band energies in a quantum-well structure having a Type I heterostructure confines electrons 56 to the conduction band 22 of the quantum-well layer 46 and confines holes 58 to the valance band 24 of the quantum-well layer 46. As a result, the electron-hole recombination process takes place between carriers confined in the same layer, a recombination process called spatially direct, and the gain of the active region 40 can be substantially higher than that of the active region 10 shown in FIG. 1. Additionally, the threshold current density and operating wavelength of photonic devices incorporating active regions with a quantum-well structure having a Type I heterostructure have little dependence on the device dimensions and operating current, respectively.

However, the high reactivity of the aluminum in the AlGaAs of the barrier layers 44 and 48 makes the active layer 40 difficult to fabricate with good crystalline quality, high optical quality and high operational reliability consistent with the growth requirements of GaAsSb.

Moreover, for the active region to generate light at 1.3 μm, the GaAsSb of the quantum-well layer 46 has an antimony (Sb) fraction of about 0.35, i.e., x=~0.35 in GaAs$_{1-x}$Sb$_x$. It is desirable that the quantum-well structure provide an electron confinement of at least 4–5 kT (where k is Boltzmann's constant and T is the temperature in Kelvin) to reduce carrier leakage over the heterojunction energy barriers at room temperature. Providing the desired electron confinement with an Sb fraction of about 0.35 in the GaAsSb of the quantum well layer 46 requires an Al fraction of about 0.25 or more, i.e., z≧0.25 in Al$_z$Ga$_{1-z}$As, in the AlGaAs of the barrier layers 44 and 48.

Antimony has a low equilibrium vapor pressure over GaAsSb, and GaAsSb has a low melting point and, hence, a low thermodynamic stability temperature. Consequently, the GaAsSb quantum-well layer 46 has to be grown at a growth temperature about 100° C. lower than the growth temperatures at which AlGaAs and GaAs are conventionally grown. Moreover, the thermodynamic stability of the Ga—As bond is low and the Sb species has a low volatility. Consequently, the GaAsSb quantum-well layer is also epitaxially grown with a very low V/III ratio and a low As/Ga ratio. The low As over-pressure and the low growth temperatures are detrimental to the crystalline quality of the AlGaAs barrier layers. Under these conditions, the high reactivity of the aluminum of the barrier layers 44 and 48 results in the AlGaAs of the barrier layers incorporating carbon and oxygen from the MOCVD precursors. These impurities act as a non-radiative recombination centers and additionally impair the long-term reliability of the photonic device. The carbon incorporated in the AlGaAs of the barrier layers 44 and 48 increases the background p-type doping level and leads to high free carrier absorption. This results in increased optical losses and a correspondingly increased threshold current density.

Finally, since AlGaAs has substantially the same lattice constant as GaAs, barrier layers of AlGaAs lack the ability to provide strain compensation between the GaAsSb of the quantum-well layer and the GaAs of the substrate. This limits the number of quantum-well layers that can be included in the quantum-well structure without an unacceptably high density of defects.

Thus, what is needed is an active region for long-wavelength photonic devices that provides such photonic devices with a low threshold current, a stable operating wavelength and a high quantum efficiency. In particular, what is needed is an active region having a Type I heterostructure in combination with a high gain, a high optical transparency, a low free carrier loss and a low density of non-radiative recombination centers. The materials constituting the active layer should have conduction and valence band offsets large enough to prevent carrier leakage under high current drive conditions. The active region should be capable of generating light in the 1.3 μm wavelength range and be substantially lattice matched to a GaAs substrate.

SUMMARY OF THE INVENTION

The invention provides a long-wavelength photonic device that comprises an active region that includes at least one quantum-well layer of a quantum-well layer material that comprises In$_y$Ga$_{1-y}$AsSb in which y≧0, and that additionally includes a corresponding number of barrier layers each of a barrier layer material that includes gallium and phosphorus. The barrier layer material has a conduction-band energy level greater than the conduction-band energy level of the quantum-well layer material and has a valence-band energy level less than the valence-band energy level of the quantum-well layer material.

As a result of the relationships between the band energy levels, the active layer includes a Type I heterostructure in which both holes and electrons are confined in the quantum-well layer and the hole-electron recombinations are spatially direct. As a result, the photonic device has a high gain, a high quantum efficiency and a low threshold current. The photonic device generates long-wavelength light at a wavelength that is substantially independent of temperature and operating current. Moreover, a barrier layer material containing phosphorus can be grown with a high V/III ratio without the risk of damaging the surface of the quantum-well layer, thus ensuring sharp, well-defined interfaces between the quantum-well layer and the barrier layers. Finally, barrier layer materials that include In and P are capable of providing strain compensation between the quantum-well layers and substrates of GaAs or InP. This enables quantum-well structures that include multiple quantum-well layers to have a low density of defects.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The elements in the drawings are not necessarily to scale, emphasis instead being placed upon clearly illustrating the principles of the invention.

DETAILED DESCRIPTION OF THE INVENTION

The invention will now be described with reference to the drawings, in which like reference numerals indicate corresponding elements throughout the several views.

Figure 3A:
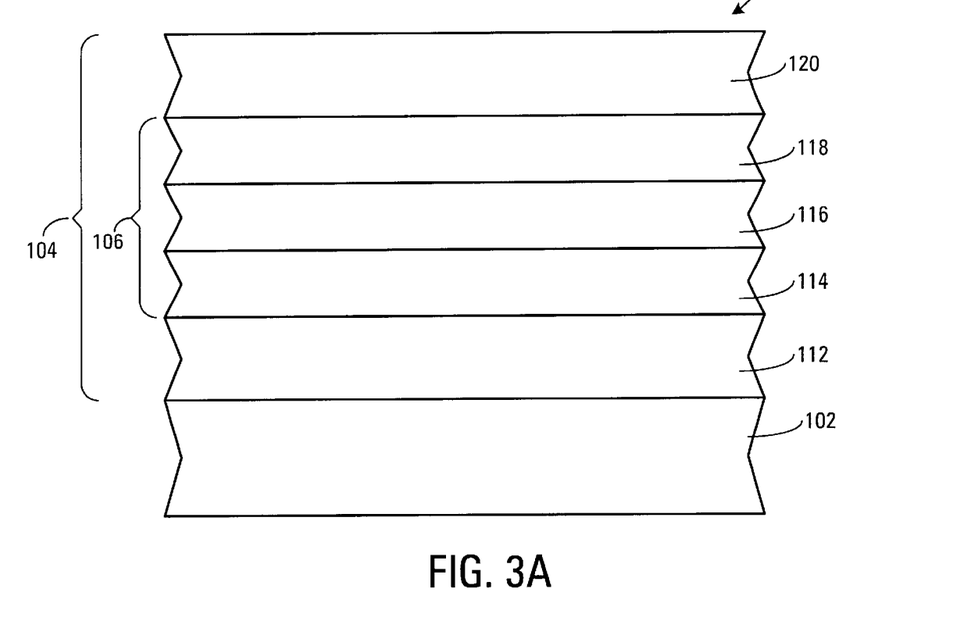
FIG. 3A is a schematic side view of part of an embodiment of a photonic device according to the invention.

FIG. 3A is a schematic side view of part of an embodiment 100 of a photonic device according to the invention. The photonic device 100 includes the substrate 102 and the active layer 104. The active layer includes the quantum-well structure 106 sandwiched between the substrate-side cladding layer 112 and the remote-side cladding layer 120. The quantum-well structure is composed of the quantum-well layer 116 sandwiched between the substrate-side barrier layer 114 and the remote-side barrier layer 118.

In the quantum-well structure 106, the quantum-well layer 116 is a layer of quantum-well layer material that includes gallium arsenide antimonide. The quantum-well layer has a thickness in the range from about 1 nm to about 10 nm.

The antimony fraction in the gallium arsenide antimonide of the quantum-well layer material of the quantum-well layer 116, i.e., the value of x in $GaAs_{1-x}Sb_x$, is set to give a bandgap energy that corresponds to the desired operating wavelength. An antimony fraction of about 0.35 gives a bandgap energy of about 0.94 electron Volts (eV), corresponding to an operating wavelength of 1.3 μm, whereas an antimony fraction of about 0.49 gives a bandgap energy of about 0.78 eV, corresponding to an operating wavelength of 1.55 μm. GaAsSb having an antimony fraction of about 0.35 has a lattice constant of about 0.580 nm, whereas GaAsSb having an antimony fraction of about 0.49 has a lattice constant of about 0.585 nm. The precise antimony fractions that give the bandgap energies corresponding to operating wavelengths of 1.3 μm and 1.55 μm additionally depend on the width of the quantum well.

Operating wavelengths different from those cited above can be provided by setting the value of the antimony fraction, x, to the appropriate value. For example, the antimony fractions different from those just described can be used to set the operating wavelength to any wavelength in the above-described 1.3 μm wavelength range or in the above-described 1.55 μm wavelength range.

In the quantum-well structure 106, the barrier layers 114 and 118 are each a layer of a barrier layer material. The barrier layer material is a Group III–V semiconductor that includes gallium and phosphorus. The barrier layer material has a conduction-band energy level greater than the conduction-band energy level of the quantum-well layer material and has a valence-band energy level less than the valence-band energy level of the quantum-well layer material. Each barrier layer has a thickness in the range from about 1 nm to about 40 nm.

The substrate-side cladding layer 112 and the remote-side cladding layer 120 are layers of aluminum gallium arsenide (AlGaAs) with an aluminum fraction in the range from about 0.2 to about 0.8, i.e., ~0.2 ≤ x ≤ ~0.8 in $Al_xGa_{1-x}As$. A typical value of x is about 0.4. The cladding layers each have a minimum thickness corresponding to one wavelength of the light generated in the quantum-well structure 106 in the material of the cladding layer, i.e., $t_c = \lambda/n_c$, where $t_c$ is the thickness of the cladding layer, $\lambda$ is the wavelength of the light generated in the quantum-well structure and $n_c$ is the refractive index of the AlGaAs of the cladding layer. The cladding layers are doped to have opposite conductivity types. Typically, the substrate-side cladding layer 112 is doped n-type and the remote-side cladding layer 120 is doped p-type, although the cladding layers may be oppositely doped.

Figure 3B:
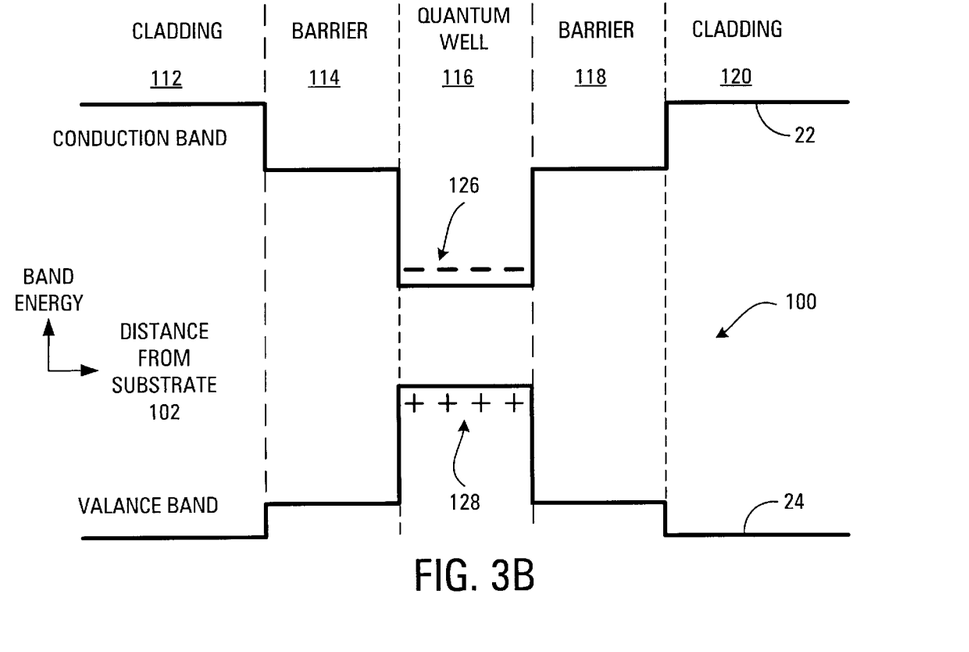
FIG. 3B is an energy-band diagram of the active region shown in FIG. 3A.

FIG. 3B is an energy-band diagram of the active region 104 in which the above-stated relationships between the conduction-band energy levels of the barrier layer material and the quantum-well layer material and between the valence-band energy levels of the barrier layer material and the quantum-well layer material apply. As a result of the relationships between the band energy levels, the quantum-well structure 106 has a Type I heterostructure. Since both holes and electrons are confined in the quantum-well layer 116, the hole-electron recombinations are spatially direct. As a result, the photonic device 100 has a high gain, a high quantum efficiency and a low threshold current and generates light at a wavelength that is substantially independent of temperature and operating current. These properties are highly desirable in a photonic device.

Figure 4:
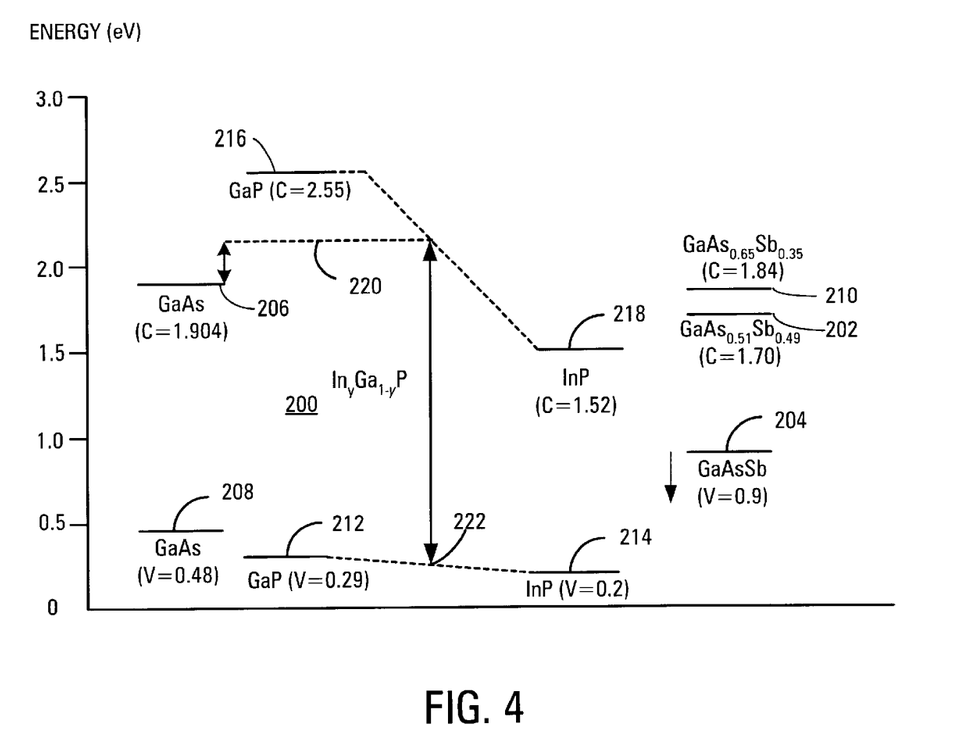
FIG. 4 is an energy-band diagram that shows the energy levels of the conduction band and the valence band of GaAsSb, GaAs and InGaP.

FIG. 4 illustrates the suitability of indium gallium phosphide as the barrier layer material. FIG. 4 is an energy diagram 200 that shows the energy levels of the conduction band and the valence band of GaAsSb, GaAs, $In_yGa_{1-y}P$ and the extremes of $In_yGa_{1-y}P$ at y=0 (Gap) and y=1 (InP). A conduction-band energy level and a valance-band energy level are shown for each material. Near each energy-band level, a number indicates a relative energy-band level in electron Volts (eV). Each number is preceded by a letter C or a letter V. The letter C indicates that the number is a conduction-band energy level, whereas the letter V indicates that the number is a valence-band energy level. The reference level to which the relative energy-band levels are referenced is that of the valance band of aluminum arsenide (AlAs). In other words, zero on the ordinate of the energy diagram 200 corresponds to the energy-band level of the valance band of AlAs.

The energy diagram 200 shows the energy level 202 of the conduction band and the energy level 204 of the valance band of the quantum-well layer material $GaAs_{1-x}Sb_x$ in which x=0.49. The energy diagram additionally shows the energy level 206 of the conduction band and the energy level 208 of the valance band of GaAs, for reference.

It should be noted that the energy levels shown in FIG. 4 are energy-band levels for the materials in an unstrained state. Juxtaposed layers of materials having different lattice constants are subject to strain that changes the energy-band levels of the materials relative to the energy-band levels in the unstrained state. For example, GaAsSb grown on GaAs is subject to compressive strain that increases the energy level of the conduction band of the GaAsSb. Accordingly, GaAsSb grown on GaAs has the Type II band alignment shown in FIG. 1, whereas the unstrained-state energy-band level shown in FIG. 4 for unstrained GaAsSb indicates that these materials would have a Type I band alignment.

The inventors have been unable to find reliable energy-band level information for the quantum-well layer material $GaAs_{1-x}Sb_x$ in which x=0.35, i.e., the form of GaAsSb suitable for use in photonic devices operating at about 1.3 $\mu$m. However, FIG. 4 shows at 210 a worst-case conduction-band energy level for GaAsSb having an antimony fraction of 0.35. This worst-case conduction-band energy level is based on the assumption that the increase in bandgap energy from 0.8 eV to 0.94 eV is all the result of an increase in the conduction-band energy level.

The energy diagram 200 also shows the energy-band levels of the conduction band and the valence band of InGaP and of the extremes of InGaP at GaP and InP. InGaP-having an indium fraction y between an upper threshold level and a lower threshold level is potentially suitable for use as the barrier material from which the barrier layers 114 and 118 are fabricated. GaP has a valance-band energy level 212 of about 0.29 eV and InP has a valence-band energy level 214 of about 0.20 eV. The valence-band energy level of InGaP with any In fraction is therefore less than the valence-band energy level of GaAsSb. Consequently, InGaP with any In fraction meets the above-stated criterion that the barrier layer material has a valence-band energy level less than the valence-band energy level of the quantum-well layer material.

The conduction-band energy level 216 of GaP is about 2.55 eV whereas the conduction-band energy level 218 of InP is about 1.52 eV. Thus, the conduction-band energy level of GaP is greater than the conduction-band energy level 202 or 210 of the quantum-well layer material, whereas the conduction-band energy level of InP is less than that of the quantum-well layer material. Accordingly, only InGaP with an In fraction less than a upper threshold level has a conduction-band energy level greater than the conduction-band energy level of the quantum-well layer material, and therefore meets the above-stated criterion that the barrier layer material have a conduction-band energy level greater than the conduction-band energy level of the quantum-well layer material. The upper threshold level of the In fraction depends on the operating wavelength of the photonic device 100, and is greater towards longer operating wavelengths. The upper threshold level is about 0.75 for an operating wavelength of 1.3 $\mu$m and is about 0.85 for an operating wavelength of 1.55 $\mu$m. The upper threshold level for other operating wavelengths in the 1.3 $\mu$m wavelength range and the 1.55 $\mu$m wavelength range will be apparent to a person of ordinary skill in the art.

Indirect recombination of the electrons and holes occurs in GaP and in InGaP in which the In fraction is less than a lower threshold level. In ternary InGaP, the lower threshold level is about 0.25. Since indirect recombination is undesirable, the InGaP of the barrier layer material should have an In fraction between the upper threshold level and the lower threshold level, i.e., in $In_yGa_{1-y}P$, ~0.25≦y≦~0.75 at about 1.3 $\mu$m and ~0.25≦y≦~0.85 at about 1.55 $\mu$m.

FIG. 4 shows an example of $In_yGa_{1-y}P$ having a conduction-band energy level 220 part-way between the conduction-band energy levels of GaP and InP, and a valence-band energy level 222 part-way between the valence-band energy levels of GaP and InP.

The lattice constant of GaP is less than the lattice constants of GaAsSb, GaAs and InP. Accordingly, InGaP having an indium fraction y less than a third threshold can provide strain compensation between the quantum-well layer 116 and the substrate 102 when the substrate material is GaAs or InP. This enables the quantum-well structure 106 to include multiple quantum-well layers with an acceptably-low level of defects. Providing strain compensation imposes a further constraint on the above-mentioned ranges of the indium fraction y.

$In_yGa_{1-y}P$ is lattice matched to GaAs when the indium fraction y is about 0.5. Accordingly, $In_yGa_{1-y}P$ in which y is less than about 0.5 will provide strain compensation between GaAsSb and a GaAs substrate. When the material of the substrate is InP, $In_yGa_{1-y}P$ with any In fraction will provide strain compensation.

Using InGaP having an In fraction that provides a conduction-band energy level greater than that of the quantum-well layer material of the quantum layer 116 as the barrier layer material confers additional advantages. Using a barrier layer material containing phosphorus rather than one containing arsenic stabilizes the quantum-well layer material of the quantum-well layer. As a result, the interfaces between the quantum-well layer and the barrier layers are sharper and better defined when the layers are grown using metalorganic chemical vapor deposition (MOCVD). When the remote barrier layer is grown from a barrier layer material containing arsenic, some of the As atoms of the barrier layer material tend to replace some of the Sb atoms in the GaAsSb quantum-well layer material of the quantum-well layer because of the extremely low Gibbs free energy of the Group III-As bond. Replacing Sb atoms with As atoms decreases the sharpness of the interface. The Group III-P bond has a higher Gibbs free energy so that, when the remote barrier layer 118 is grown from a barrier layer material contains phosphorus, substantially fewer P atoms replace the Sb atoms in the quantum-well layer material. Consequently, barrier layers of barrier layer materials containing phosphorus can be grown with high V/III ratios without the risk of damaging the surface of the quantum-well layer and decreasing the sharpness of the interface between the layers.

The invention has been described with reference to a specific example in which the quantum-well layer material constituting the quantum-well layer 116 includes GaAsSb. However, the quantum-well layer material may additionally include indium. Thus, in a photonic device according to the invention, the quantum-well layer material includes indium gallium arsenide antimonide in which the indium fraction is equal to or greater than zero, i.e., $In_yGa_{1-y}AsSb$ in which y≧0.

The inventors believe that adding In to the quantum-well layer material increases reliability and improves the quality of the interface between the quantum-well layer and the barrier layers. It is thought that these improvements are the result of the Gibbs free energy of formation of InGaAsSb being different from that of GaAsSb. Specifically, it is thought that the bond between In and Sb is stronger than that between Ga and Sb, so the tendency of As atoms to replace Sb atoms when the barrier layer is grown is less when the quantum-well layer material includes In. Moreover, including In in the materials on both sides of the interface may also improve the sharpness of the interface by reducing the tendency of In from the barrier layers to migrate into the quantum-well layer. Moreover, GaAsSb is difficult to grow with a high fraction of Sb due to the difficulty of incorporating the Sb. Including In in the quantum-well layer material enables the same bandgap reduction to be obtained with a lower fraction of Sb.

The invention has been described with reference to an example in which the barrier layer material constituting the barrier layers 114 and 115 includes $In_yGa_{1-y}P$ in which the indium fraction y is between an upper threshold value and a lower threshold value. However, other semiconductor materials may be used as the barrier layer material from which the barrier layers 114 and 118 are fabricated. Examples include $In_yGa_{1-y}AsP$ in which the indium fraction y is between an upper threshold level and a lower threshold level, $Al_zIn_yGa_{1-y-z}P$ in which the indium fraction y is between an upper threshold level and a lower threshold level greater than zero and less than a threshold level and $Al_zIn_yGa_{1-y-z}AsP$.

When $In_yGa_{1-y}As_{1-x}Sb_x$ is used as the quantum layer material, a suitable barrier layer material is $Al_zIn_yGa_{1-y-z}As_aP_bSb_{1-a-b}$, although others of the above-mentioned barrier layer materials may alternatively be used.

Some of the barrier layer materials will now be described in more detail.

$In_yGa_{1-y}As_{1-a}P_a$ in which the indium fraction y is equal to or greater than zero and is less than an upper threshold level. The phosphorus fraction, a, of the $In_yGa_{1-y}As_{1-a}P_a$ barrier layer material is greater than the level below which the barrier layer and the quantum-well layer do not form a Type I heterostructure and is less than the level above which indirect recombination occurs. The range of the P fraction that meets these criteria depends on the In fraction. The range additionally depends on the strain in the GaAsSb of the quantum-well layer that, in turn, depends on the composition of the barrier layer material, including the P fraction a. Barrier layers of $In_yGa_{1-y}As_{1-a}P_a$ are also capable of providing strain compensation between the quantum-well layer 116 and a substrate 102 of either GaAs or InP.

$Al_zIn_yGa_{1-x-y}P$. The quantum-well structure 104 has a Type-I heterostructure with this barrier layer material. The inclusion of aluminum in any of the above-mentioned barrier layer materials provides additional options for formulating a barrier layer material that meets the above-described energy level criteria for forming a Type-I heterostructure, and that additionally provides direct recombination and strain compensation. $Al_zIn_yGa_{1-x-y}P$ gives better carrier confinement than InGaP due to its wider bandgap. Moreover, in $Al_zIn_yGa_{1-x-y}P$, the tendency for P atoms to replace Sb atoms on the exposed surface of the quantum-well layer is relatively weak, so that $Al_zIn_yGa_{1-x-y}P$ can be grown at the high V/III ratios that are typically used to obtain high-quality Al-containing layers.

$Al_xIn_yGa_{1-x-y}As_{1-a-b}P_aSb_b$. As noted above, the quantum-well layer material may additionally include In. $Al_xIn_yGa_{1-x-y}As_{1-a-b}P_aSb_b$ is a barrier layer material suitable for use when the quantum-well layer material is InGaAsSb. $Al_xIn_yGa_{1-x-y}As_{1-a-b}P_aSb_b$ has the advantage that it can be grown with a high V/III ratio, which improves the crystalline quality of the barrier layers.

With all of the material systems described above, energy-band diagrams similar to FIG. 4 can be used to determine constraints on the ranges of the fractions of the constituent elements that result in the quantum-well structure 104 having a Type-I heterostructure. Data characterizing the variation of lattice constant with composition may additionally be used to further constrain the fractions of the constituent elements to those that provide strain compensation between the quantum-well layer and the substrate.

As will be described in detail below, the photonic device 100 may also include one or more additional layers sandwiched between the substrate 102 and the substrate-side cladding layer 112. Additionally or alternatively, the photonic device 100 may also include one or more additional layers on the remote cladding layer 120.

In the example shown, the quantum-well structure 106 is composed of the single quantum-well layer 116 sandwiched between the substrate-side barrier layer 114 and the remote-side barrier layer 118. However, the gain of the photonic device 100 may be increased by structuring the quantum-well structure to include two quantum-well layers interleaved with three barrier layers, and may be further increased by structuring the quantum-well structure to include n quantum-well layers (n>2) interleaved with n+1 barrier layers. The strain compensation provided between the quantum-well layer 116 and the material of the substrate 102 by many of the barrier layer materials described above enables a quantum-well structure that includes many quantum-well layers to be fabricated with an acceptably-low density of defects, notwithstanding the lattice mismatch between the GaAsSb or InGaAsSb of the quantum-well layers and the semiconductor material of the substrate 102.

Figure 5:
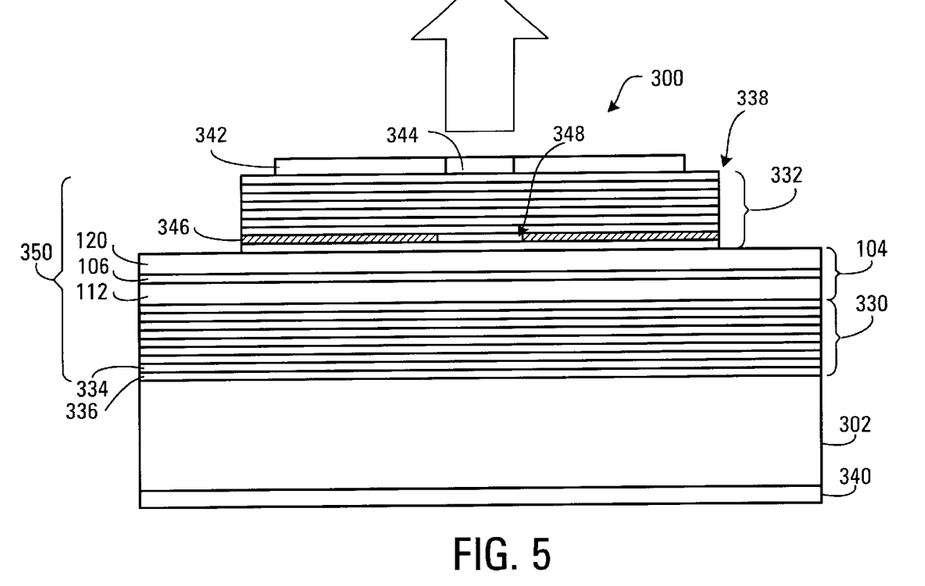
FIG. 5 is a side view of an embodiment of a photonic device according to the invention that is a vertical-cavity surface-emitting laser.

Additional embodiments, namely, a vertical-cavity, surface-emitting laser (VCSEL) and an edge-emitting laser (EEL), of a photonic device according to the invention operating at a wavelength of about 1.3 μm will now be described with reference to FIGS. 5 and 6, respectively. Turning first to FIG. 5, the VCSEL 300 is composed of the substrate-side distributed Bragg reflector (DBR) 330, the active layer 104 and the remote-side DBR 332, epitaxially grown, in order, on the substrate 302. In a preferred embodiment, the semiconductor material of the substrate is single-crystal gallium arsenide.

Each of the DBRs 330 and 332 is composed of multiple layer pairs. Each layer pair is composed of a layer of a high refractive index material and a layer of a low refractive index material. The materials of the layers are optically transparent at the wavelength of the light generated in the active region 104. Exemplary layer 334 of higher refractive index material and layer 336 of lower refractive index material constituting an exemplary layer pair of the substrate-side DBR 330 are shown. Each layer has a thickness equal to one-quarter of the wavelength of the light generated in the active region 104 in the material of the layer, i.e., $t_b=\lambda/4n_b$, where $t_b$ is the thickness of the layer, $\lambda$ is the in vacuo wavelength of the light generated in the active region and $n_b$ is the refractive index of the material of the layer.

In the example shown, both DBR 330 and 332 are electrically conductive, at least in part, and are therefore fabricated of doped semiconductor materials. In embodiments incorporating non-conductive DBRs, such DBRs may be fabricated from dielectric materials. Also in the example shown, the lower refractive index semiconductor material of layer 336 is aluminum gallium arsenide and the higher refractive index semiconductor material of layer 334 is gallium arsenide. The number of layer pairs shown in FIG. 5 is substantially reduced to simplify the drawing: in a practical laser, the number of layer pairs is sufficient to provide the substrate-side DBR 330 and the remote-side DBR 332 with a reflectivity of greater than about 99% and of about 95%, respectively, at the wavelength of the light generated in the active region 104. Also, in addition to the layer pairs, each of the DBRs is composed of an additional layer of low refractive index material.

The semiconductor materials of the DBRs 330 and 332 are doped to have opposite conductivity types. Typically, the semiconductor materials of the substrate-side DBR 330 are doped n-type and those of the remote-side DBR 332 are doped p-type, although the semiconductor materials of the DBRs may be oppositely doped.

The active layer 104 is sandwiched between the substrate-side DBR 330 and the remote-side DBR 332. The DBRs and the active layer form the optical cavity 350 that is resonant at the wavelength of the light generated in the active layer 104. As described above with reference to FIG. 3A, the active layer 104 is composed of the quantum-well structure 106 sandwiched between the substrate cladding layer 112 and the remote-side cladding layer 120. The cladding layers 112 and 120 are doped to have the same conductivity type as the adjacent DBRs 330 and 332, respectively.

The quantum-well structure 106 is composed of at least one quantum-well layer of a quantum-well layer material that includes indium gallium arsenide antimonide in which the indium fraction is equal to or greater than zero, and a corresponding number of barrier layers. Each of the barrier layers is composed of barrier layer material that includes gallium and phosphorus. The barrier layer material has a conduction-band energy level greater than the conduction-band energy level of the quantum-well layer material and has a valence-band energy level less than the valence-band energy level of the quantum-well layer material.

Typically, dopants are not added to the quantum-well layer material and the barrier layer material when the quantum-well layer and the barrier layers are grown. Details of the quantum-well structure, the quantum-well layer and the barrier layers are described above and these elements will therefore not be described again here.

After the layer structure composed of the substrate 302, the substrate-side DBR 330, the active layer 104 and the remote-side DBR 332 has been fabricated, part of the remote-side DBR 332 is etched away to form the mesa 338. A current confinement structure is formed in the mesa. For example, ions may be selectively implanted into the mesa to decrease the conductivity of the mesa in all but a small, substantially central, conductive region. The conductivity of the mesa remains substantially unchanged in the conductive region.

In the example shown, however, the current-confinement structure is formed by exploiting the dependence of the oxidation rate of AlGaAs on the aluminum fraction of the AlGaAs. When the remote-side DBR 332 is grown, at least one of the layers of AlGaAs is grown with an aluminum fraction substantially higher than that of the remaining layers of AlGaAs. For example, the high-aluminum fraction layer may have an aluminum fraction greater than about 0.9 when the remaining layers of AlGaAs have an aluminum fraction of in the range from about 0.75 to about 0.85. An exemplary high-aluminum fraction AlGaAs layer is shown at 346. Then, after formation of the mesa 338, the VCSEL is heated in an oxidizing atmosphere, such as an atmosphere with a high water vapor content. The oxidizing atmosphere oxidizes the exposed areas of all the layers of AlGaAs, the oxidation progressing radially inwards from the side of the mesa. However, oxidation progresses substantially faster in the high-aluminum fraction AlGaAs layer 346 than in the remaining AlGaAs layers. At the end of the oxidation process, almost all of the high-aluminum fraction AlGaAs layer is oxidized to form a wide annular region of aluminum oxide surrounding the conductive region 348. Aluminum oxide has a substantially lower electrical conductivity than doped AlGaAs. The high-aluminum AlGaAs remains unoxidized in the conductive region 348 so that the optical and electrical properties of the conductive region remain substantially unchanged. The remaining AlGaAs layers are oxidized only in a narrow annular region at their peripheries.

The area of the conductive region, e.g., 348, defined by ion implantation, oxidation or otherwise, is small compared with that of the mesa 338. During operation of the VCSEL 300, the laser current is confined to the conductive region, where it achieves a very high current density. The laser current enters the active region 104 from the conductive region. Current spreading is relatively small so that the current density is also very high in the active region. The very high current density lowers the threshold current of the VCSEL.

The substrate-side contact layer 340, composed of at least one layer of metal, is deposited on the surface of the substrate 302 remote from the substrate-side DBR 330. The remote-side contact layer 342 is deposited on the exposed surface of the remote-side DBR 332 and is patterned to define the light exit port 344. The light exit port is radially aligned with the conductive region 348. The remote-side contact layer is composed of at least one layer of metal, and may additionally include at least one layer of highly-doped semiconductor material to reduce the contact resistance between the metal layer and the remote-side DBR 332.

Figure 6:
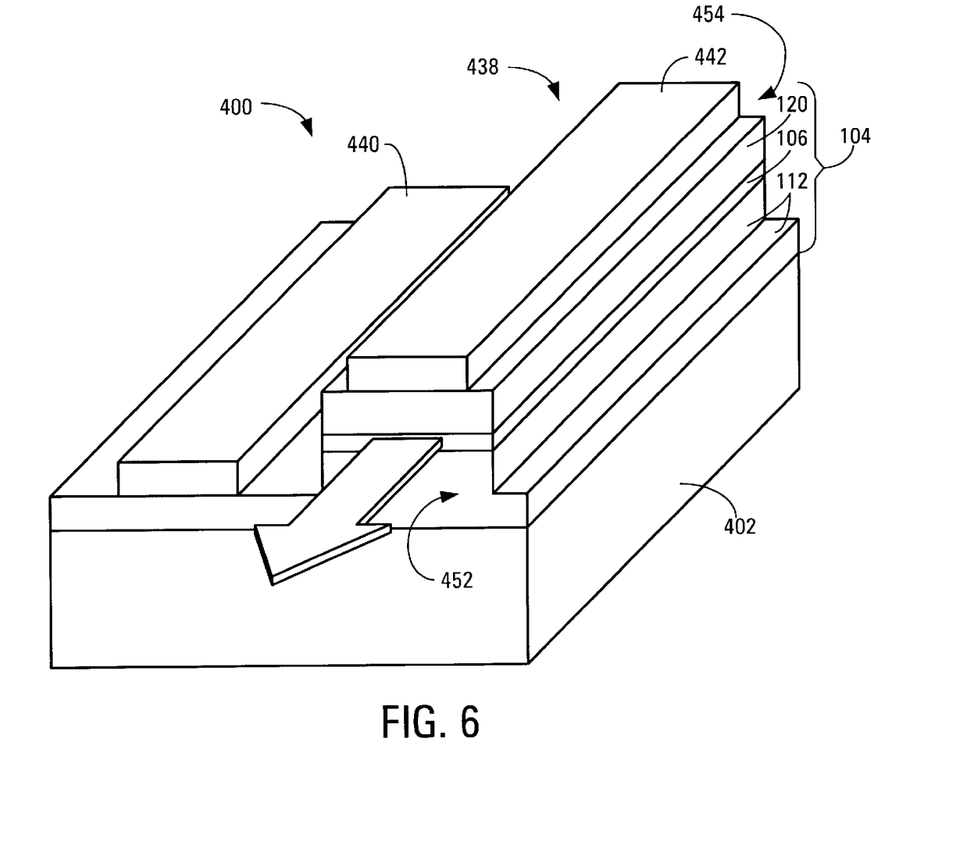
FIG. 6 is an isometric view of an embodiment of a photonic device according to the invention that is an edge-emitting laser.

FIG. 6 shows the edge-emitting laser (EEL) 400 incorporating a quantum-well structure according to the invention. The EEL is composed of the active layer 104 epitaxially grown on the substrate 402. In a preferred embodiment, the semiconductor material of the substrate is single-crystal gallium arsenide.

As described above, the active layer 104 is composed of the substrate-side cladding layer 112, the quantum-well structure 106 and the remote-side cladding layer 120. The substrate-side cladding layer, the quantum-well structure and the remote-side cladding layer are epitaxially grown, in order, in the substrate 402. The cladding layers 112 and 120 are doped to have opposite conductivity types.

The quantum-well structure 106 is composed of at least one quantum-well layer of a quantum-well layer material that includes indium gallium arsenide antimonide in which the indium fraction is equal to or greater than zero, and a corresponding number of barrier layers. Each of the barrier layers is composed of a barrier layer material, which is a Group III–V semiconductor that includes gallium and phosphorus. The barrier layer material has a conduction-band energy level greater than the conduction-band energy level of the quantum-well layer material and has a valence-band energy level less than the valence-band energy level of the quantum-well layer material.

Typically, dopants are not added to the quantum-well layer material and the barrier layer material when the quantum-well layer 116 and the barrier layers 114 and 118 are grown. Details of the quantum-well structure, the quantum-well layer and the barrier layers are described above with reference to FIGS. 3A, 3B and 4, and these elements will therefore not be described again here.

The layer structure composed of the substrate-side cladding layer 112, the quantum-well structure 106 and the remote-side cladding layer 120 is selectively etched to define the ridge structure 438. The ridge structure extends part-way into the thickness of the substrate cladding layer 112.

The contact layer 440 is located on the surface of the substrate-side cladding layer 112 exposed by the etching process. The contact layer 442 is located on the surface of the remote-side cladding layer 120.

The EEL additionally includes the cleaved facets 452 and 454 that provide reflective surfaces that define the ends of the optical cavity additionally defined by the ridge structure 438.

Figure 7:
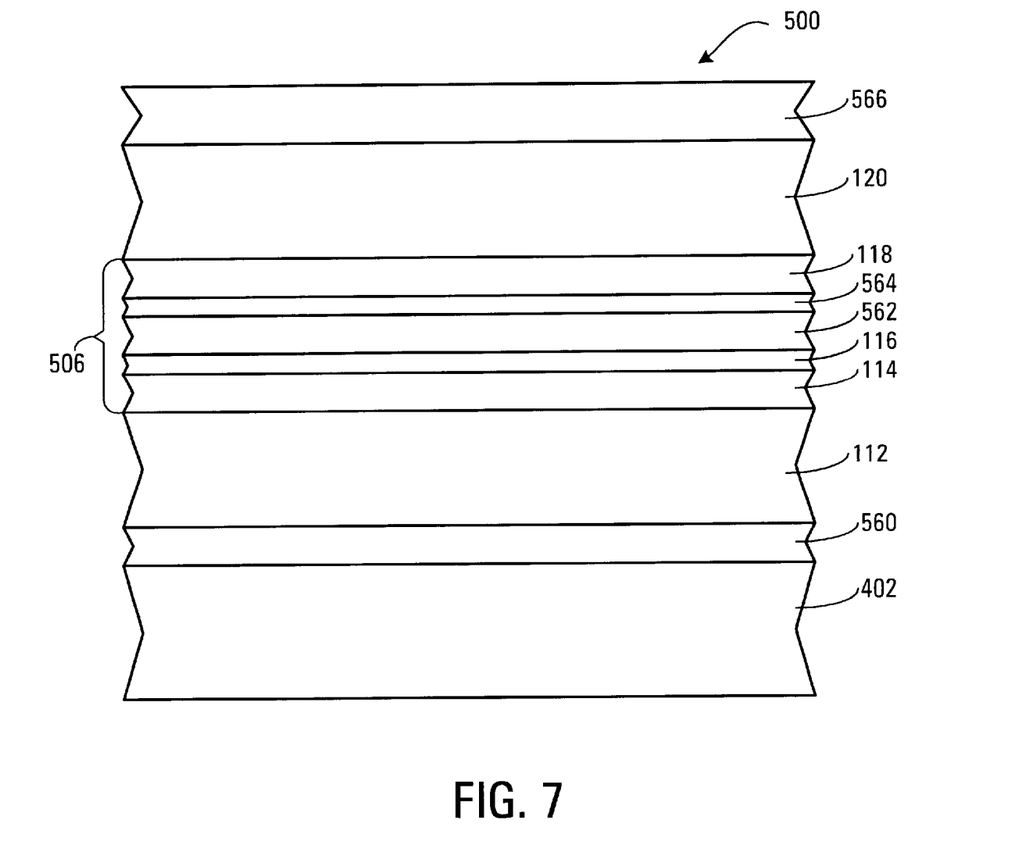
FIG. 7 is a side view showing part of a practical example of a layer structure from which an edge-emitting laser, as an example of a photonic device according to the invention, can be fabricated.

FIG. 7 is a side view showing part of a practical example of the layer structure 500 from which the EEL 400 can be fabricated. In the example shown, the quantum-well structure 506 is a double quantum-well structure composed of two quantum-well layers and three barrier layers. In the example to be described, the barrier layer material is InGaP.

In the layer structure 500, the substrate 402 was a 350 $\mu$m-thick wafer of 1-0-0 n-type GaAs. The GaAs of the substrate was doped n-type with silicon in the range from $2-4\times10^{18}$ atoms cm$^{-3}$.

The 500 nm-thick buffer layer 560 of n-type GaAs was grown on the substrate. The GaAs of the buffer layer was doped with silicon at about $2\times10^{18}$ atoms cm$^{-3}$.

The 1.2 $\mu$m-thick substrate-side cladding layer 112 of n-type $Al_{0.45}Ga_{0.55}As$ was grown on the buffer layer 560. The AlGaAs of the substrate-side cladding layer was doped with silicon at about $5\times10^{17}$ atoms cm$^{-3}$.

The 30 nm-thick substrate-side barrier layer 114 of $In_{0.49}Ga_{0.51}P$ was grown on the substrate-side cladding layer 112.

The 8 nm-thick quantum-well layer 116 of $GaAs_{0.65}Sb_{0.35}$ was grown on the substrate-side barrier layer 114.

The 30 nm-thick additional barrier layer 562 of $In_{0.49}Ga_{0.51}P$ was grown on the quantum-well layer 116.

The 8 nm-thick additional quantum-well layer 564 of $GaAs_{0.65}Sb_{0.35}$ was grown on the additional barrier layer 562.

The 30 nm-thick remote-side barrier layer 118 of $In_{0.49}Ga_{0.51}P$ was grown on the additional quantum-well layer 564.

During growth of the layers constituting the quantum-well structure 506, no dopants were added to the GaAsSb of the quantum-well layers or to the InGaP of the barrier layers.

The 1.2 $\mu$m-thick remote-side cladding layer 120 of p-type $Al_{0.45}Ga_{0.55}As$ was grown on the remote-side barrier layer 118. The AlGaAs of the remote-side cladding layer was doped with carbon at about $5\times10^{17}$ atoms cm$^{-3}$.

The 200 nm-thick contact layer 566 of p-type GaAs was grown on the remote-side cladding layer 120. The GaAs of the contact layer was doped with carbon at about $2\times10^{19}$ atoms cm$^{-3}$.

The grown layers were grown by metalorganic chemical vapor deposition (MOCVD). Precursors for aluminum, gallium, indium, phosphorus, arsenic, carbon and silicon are known in the art. Suitable precursors for antimony include trimethylantimony and triethylantimony. Most of the layers are grown at conventional growth temperatures, i.e., at temperatures between 550° C. and 650° C. The cladding layers of AlGaAs were grown at a temperature in the range from about 560° C. to about 600° C. and the quantum-well layers of GaAsSb were grown at about 480° C. The grown layers may alternatively be grown by molecular beam epitaxy (MBE) or another suitable process.

In the layer structure 500 just described, gallium arsenide phosphide with a phosphorus fraction of about 0.25, i.e., a=0.25 in $GaAs_{1-a}P_a$, may be used as the barrier layer material instead of InGaP.

The layer structure 500 just described may also form the basis of a layer structure from which the VCSEL 300 shown in FIG. 5 can be fabricated. A substrate-side DBR (not shown in FIG. 7, but corresponding to substrate-side DBR 330 shown in FIG. 5) composed of about 20.5 layer pairs, each composed of an approximately 95 nm-thick layer of n-type GaAs and an approximately 100 nm-thick layer of n-type AlGaAs, is grown on the buffer layer 560.

The substrate-side cladding layer 112 is then grown on the substrate-side DBR, followed by the active layer 506 and the remote-side cladding layer 120. The cladding layers are designed so that the cavity composed of the cladding layers 112 and 120 and the active region 506 has a thickness equal to one wavelength of the light generated in the quantum well structure in the material of the cavity.

Then, after the remote-side cladding layer 120 has been grown, a remote-side DBR (not shown in FIG. 7, but corresponding to remote-side DBR 332 shown in FIG. 5) composed of about 15.5 layer pairs, each composed of an approximately 95 nm-thick layer of p-type GaAs and an approximately 100 nm-thick layer of p-type AlGaAs, is grown on the remote-side cladding layer. The cap layer 566 is then grown on the remote-side DBR.

In the AlGaAs layers constituting part of the substrate-side and remote-side DBRs, the aluminum fraction is typically in the range from about 0.75 to about 0.85. The specific Al fraction and thickness of the AlGaAs layers depends upon wavelength of the light generated on the quantum well region. At least one of the AlGaAs layers may be grown with a higher Al fraction than the remaining AlGaAs layers to enable a current-confinement structure to be formed in the VCSEL, as described above.

The remote-side DBR may alternatively be composed of a substantially smaller number of layer pairs each composed of a layer of a low refractive index dielectric material such as silicon dioxide and a layer of a high refractive index dielectric material such as silicon nitride. In this case, the remote-side DBR is not electrically conductive, and an electrical connection is made to the remote-side cladding layer 120.

The layer structure 500 just described may also be fabricated on an InP substrate to make a layer structure from which an EEL operating in the 1.55 $\mu$m wavelength range can be made.

In an embodiment of the layer structure 500 based on InP, the substrate 402 was a wafer of InP doped n-type with sulfur atoms at about 2×18 atoms cm$^{-3}$.

The 200 nm-thick buffer layer 560 of n-type InP was grown on the substrate. The InP of the buffer layer was doped with silicon or sulfur in the range from about $1\times10^{18}$ atoms cm$^{-3}$ to about $2\times10^{18}$ atoms cm$^{-3}$.

The 1.5 $\mu$m-thick substrate-side cladding layer 112 of InP was grown on the buffer layer 560. The InP of the substrate-side cladding layer was doped with silicon or sulfur at about $1\times10^{18}$ atoms cm$^{-3}$.

A 1 $\mu$m-thick substrate-side confinement layer (not shown) of InGaAsP having a bandgap corresponding to the emission wavelength was grown on the substrate-side cladding layer 112.

The 30 nm-thick substrate-side barrier layer 114 of $In_{0.85}Ga_{0.15}P$ was grown on the substrate-side confinement layer.

The 8 nm-thick quantum-well layer 116 of $GaAs_{0.51}Sb_{0.49}$ was grown on the substrate-side barrier layer 114.

The 30 nm-thick additional barrier layer 562 of $In_{0.85}Ga_{0.15}P$ was grown on the quantum-well layer 116.

The 8 nm-thick additional quantum-well layer 564 of $GaAs_{0.51}Sb_{0.49}$ was grown on the additional barrier layer 562.

The 30 nm-thick remote-side barrier layer 118 of $In_{0.85}Ga_{0.15}P$ was grown on the additional quantum-well layer 564.

A 2 μm-thick remote-side confinement layer (not shown) of InGaAsP having a bandgap corresponding to the emission wavelength was grown on the remote-side barrier layer 118.

During growth of the confinement layers (not shown) and the layers constituting the quantum-well structure 506, no dopants were added to the materials of these layers.

The 1.5 μm-thick remote-side cladding layer 120 of p-type InP was grown on the remote-side confinement layer. The InP of the remote-side cladding layer was doped with zinc at about $2 \times 10^{18}$ atoms $cm^{-3}$.

The 50 nm-thick contact layer 566 of p-type InGaAs was grown on the remote-side cladding layer 120. The InGaAs of the contact layer was doped with zinc in a range from about $1 \times 10^{19}$ atoms $cm^{-3}$ to about $2 \times 10^{19}$ atoms $cm^{-3}$.

The long-wavelength photonic devices according to the invention have a number of advantages over conventional long-wavelength photonic devices. Using InGaAsSb (In≧0) as the material of the quantum-well layer together with barrier layers of a barrier layer material that includes gallium and phosphorus and that has a conduction-band energy level greater than the conduction-band energy level of the quantum-well layer material and a valence-band energy level less than the valence-band energy level of the quantum-well layer material provides the quantum-well structure with a Type-I heterostructure. The Type-I heterostructure provides the photonic device with a high quantum efficiency and a low threshold current and makes the wavelength properties of the photonic device substantially independent of operating current and temperature.

Epitaxial growth techniques for growing GaAs can easily be adapted to grow GaAsSb and InGaAsSb. High purity antimony sources, such as trimethylantimony (TMSb) and triethylantimony (TESb) are readily available from many different vendors. These antimony sources exhibit extremely low levels of contaminants such as oxygen and moisture and therefore enable high-purity epitaxial layers of GaAsSb and InGaAsSb to be grown.

Moreover, in the long-wavelength photonic devices according to the invention, the barrier layer material can be formulated to provide strain compensation between the quantum-well layer material of the quantum-well layer and a GaAs substrate. GaAs substrates are the largest, cheapest, most readily available and have the largest number of wafer orientations available of all the compound semiconductor substrates.

In long-wavelength photonic devices according to the invention that are VCSELs, the above-described active layer can be used with both n-type and p-type GaAs/AlGaAs distributed Bragg reflectors (DBRs). AlGaAs/AlGaAs DBR technology is a mature technology. Techniques for fabricating AlGaAs/AlGaAs DBRs with low resistance, low optical loss and high reflectivity are well known in the art.

Moreover, DBRs of GaAs/AlGaAs grown on a GaAs substrate obviate the need for lattice matching during growth of the layer structure. This makes the layer structure relatively easy to fabricate. Moreover, processes are well known in the art for wet and dry etching, planarizing, contact forming, ion implanting, selective oxidation, etc. in devices that are grown on GaAs substrates and use GaAs/AlGaAs DBRs. These processes can easily be extended to fabricate device structures that include GaAsSb quantum-well layers.

This disclosure describes the invention in detail using illustrative embodiments. However, it is to be understood that the invention defined by the appended claims is not limited to the precise embodiments described.

We claim:

1. A long-wavelength photonic device, comprising an active region including:

at least one quantum-well layer of a quantum-well layer material comprising $In_yGa_{1-y}AsSb$ in which y≧0; and a corresponding number of barrier layers with which the at least one quantum well layer is interleaved, each of the barrier layers of a barrier layer material including gallium and phosphorus, the barrier layer material having a conduction-band energy level greater than the conduction-band energy level of the quantum-well layer material and a valence-band energy level less than the valence-band energy level of the quantum-well layer material.

2. The long-wavelength photonic device of claim 1, in which the barrier layer material is selected from the group consisting of InGaP, AlInGaP, GaAsP, AlGaAsP, InGaAsP, AlInGaAsP and AlInGaAsPSb.

3. The long-wavelength photonic device of claim 1, in which:

the photonic device additionally comprises a substrate of GaAs; and the barrier layer material provides strain compensation between the at least one quantum-well layer and the substrate.

4. The long-wavelength photonic device of claim 3, in which the quantum-well layer material has an antimony fraction of about 0.35.

5. The long-wavelength photonic device of claim 1, in which:

the photonic device additionally comprises a substrate of InP; and the barrier layer material provides strain compensation between the at least one quantum-well layer and the substrate.

6. The long-wavelength photonic device of claim 5, in which the GaAsSb of the quantum-well layer material has an antimony fraction of about 0.49.

7. The long-wavelength photonic device of claim 1, in which the active layer additionally includes cladding layers between which the at least one quantum-well layer and the barrier layers are sandwiched.

8. The long-wavelength photonic device of claim 7, in which the cladding layers are layers of AlGaAs.

9. The long-wavelength photonic device of claim 1, in which the photonic device is structured to operate in a 1.3 micrometer wavelength range.

10. The long-wavelength photonic device of claim 1, in which the photonic device is structured to operate in a 1.55 micrometer wavelength range.

11. The long-wavelength photonic device of claim 1, additionally comprising mirror layers between which the active region is located, at least alternate ones of the mirror layers being layers of AlGaAs.

12. The long-wavelength photonic device of claim 11, in which at least one of the layers of AlGaAs includes an annular oxide region providing a current confinement structure.

13. The long-wavelength photonic device of claim 11, in which at least one of the mirror layers includes a bonded or deposited structure.

14. The long-wavelength photonic device of claim 13, in which at least one of the mirror layers includes an oxide region.

15. The long-wavelength photonic device of claim 1, in which the barrier layer material has a bulk lattice constant less than the bulk lattice constant of the quantum-well layer material.

16. The long-wavelength photonic device of claim 1, in which:
   the indium fraction of the quantum-well layer material is greater than zero; and
   the barrier layer material includes AlInGaAsPSb.

17. The long-wavelength photonic device of claim 1, in which the barrier layer material includes $GaAs_{1-a}P_a$ in which a is greater than a level below which the conduction-band energy level of the barrier layer material is not greater than the conduction-band energy level of the quantum-well layer material, and is less than a level above which indirect recombination occurs.

18. The long-wavelength photonic device of claim 1, in which:
   the photonic device emits light at about 1.3 μm; and
   the barrier layer material includes $In_yGa_{1-y}P$ in which $~0.25 \leq y \leq ~0.75$.

19. The long-wavelength photonic device of claim 1, in which:
   the photonic device emits light at about 1.55 μm; and
   the barrier layer material includes $In_yGa_{1-y}P$ in which $~0.25 \leq y \leq ~0.85$.

* * * * *